US010037246B1

United States Patent
Laws et al.

(10) Patent No.: US 10,037,246 B1
(45) Date of Patent: Jul. 31, 2018

(54) SYSTEM AND METHOD FOR MEMORY CONTROL HAVING SELF WRITEBACK OF DATA STORED IN MEMORY WITH CORRECTABLE ERROR

(71) Applicant: CADENCE DESIGN SYSTEMS, INC., San Jose, CA (US)

(72) Inventors: Landon Laws, Austin, TX (US); Anne Hughes, Austin, TX (US); John MacLaren, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 85 days.

(21) Appl. No.: 15/218,279

(22) Filed: Jul. 25, 2016

(51) Int. Cl.
| | |
|---|---|
| G11C 29/00 | (2006.01) |
| G06F 11/10 | (2006.01) |
| G11C 29/36 | (2006.01) |
| G11C 29/38 | (2006.01) |
| G06F 3/06 | (2006.01) |

(52) U.S. Cl.
CPC ........ G06F 11/1076 (2013.01); G06F 3/0604 (2013.01); G06F 3/064 (2013.01); G06F 3/0619 (2013.01); G06F 3/0659 (2013.01); G06F 3/0673 (2013.01); G11C 29/36 (2013.01); G11C 29/38 (2013.01)

(58) Field of Classification Search
CPC ............... G06F 11/1044; G06F 3/0659; G06F 13/1642; G06F 3/061; G06F 3/0673; G06F 12/0862; G06F 12/0897; G06F 12/0811; G06F 12/0886; G06F 2212/6022; G06F 9/3806; G06F 9/3802; G06F 9/3844; G06F 2212/6028; G06F 2212/602; H03M 13/09; H03M 13/19
See application file for complete search history.

(56) References Cited

U.S. PATENT DOCUMENTS

| | | | |
|---|---|---|---|
| 6,182,177 B1* | 1/2001 | Harriman | G06F 13/18 710/112 |
| 9,432,298 B1* | 8/2016 | Smith | H04L 49/9057 |
| 2007/0186135 A1* | 8/2007 | Flachs | G06F 11/1044 714/752 |
| 2009/0070654 A1* | 3/2009 | Flachs | G06F 11/1044 714/758 |

(Continued)

*Primary Examiner* — Guerrier Merant
(74) *Attorney, Agent, or Firm* — Rosenberg, Klein & Lee

(57) ABSTRACT

A system and method are provided for controlling access to memory to support processing of a master control operation. A data control portion is configured to carry out a plurality of data access operations on the memory device, including read, write, and read-modify-write operations for selectively addressed storage locations defined in the memory. An error control portion executes to detect error in a data segment as stored in the memory. The error control portion corrects a data segment read from the memory device for at least one type of detected error. A command control portion generates commands for actuating the data access operations of the data control portion. The command control portion includes a corrective writeback unit executable responsive to detection of correctable error in a data segment to actuate a read-modify-write operation to the data segment's storage locations. The corresponding storage locations of the memory are thereby adaptively scrubbed.

15 Claims, 5 Drawing Sheets

(56) References Cited

U.S. PATENT DOCUMENTS

2012/0072673 A1\* 3/2012 Chirca ............... G06F 12/0862
　　　　　　　　　　　　　　　　　　　711/137
2013/0198416 A1\* 8/2013 Zhu ..................... G06F 3/0659
　　　　　　　　　　　　　　　　　　　710/6

\* cited by examiner

SYSTEM AND METHOD FOR MEMORY CONTROL HAVING SELF WRITEBACK OF DATA STORED IN MEMORY WITH CORRECTABLE ERROR

BACKGROUND OF THE INVENTION

The subject system and method are generally directed to memory controllers having measures for error detection and correction. More specifically, the subject system and method provide for a memory controller that is executable to self-actuate a writeback transaction to effect corrected storage of data in a given memory device responsive to detection of correctable error in that data as stored. Preferably, such measures are sufficiently incorporated in the memory controller that the memory controller itself may generate the writeback transaction without intervention of the particular application program or other master computer program that it serves.

Memory controllers are well known in the art. They are implemented as digital circuits dedicated to controlling/managing the flow of data written to and read from one or more memory devices, and to preserve the same by periodically refreshing the memory as needed. They may be suitably formed as separate devices or integrated with a central processing unit or other main controller, and serve the memory storage and access needs of various control or user application 'master' operations processed thereby. Memory controllers implement the logic necessary to read from and write to various types of memory devices, examples of which include dynamic random access memory (DRAM), as well as electrically programmable types of non-volatile memory such as flash memory, and the like.

To minimize the consequences of data corruption due to random sources of error, various error detection and correction measures are employed in the art for the storage and retrieval of data from memory devices. One example of the various known measures is the use of an Error-Correcting Code (ECC). ECC measures are widely implemented in memory controllers heretofore known in various computer applications that may be particularly vulnerable to data corruption, or more generally in high data rate or other such applications where substantial immunity to data corruption is particularly important, and the added processing burden and complexity of ECC are not prohibitive. ECC measures generally involve adding redundant ECC bits to a transmitted data segment according to a predetermined code (of selected ECC format). These ECC bits are of parity-type, and permit the data segment to be properly recovered at the receiving end (by a receiver suitably configured for the given ECC format), even if certain correctable errors were introduced in the transmission or storage of that data segment. The degree to which the errors are correctable would depend on the relevant properties of the particular code being used.

Known memory controllers suitably configured in this regard execute with sufficient autonomy to relieve the master of the processing burden to carry out routine management of data flow to and from the given memory. They also relieve the master's burden of generating the necessary transaction(s) to carry out proper recovery of corrupted data segments stored in memory with correctable error. When it comes to actually remedying the corrupted storage of data, however, known memory controllers rely on conventional scrubbing transactions, which in turn rely on the master operation's interactively providing the read-modify-write commands for appropriate writeback of data. There is therefore a need for a memory controller system capable of sufficiently autonomous operation to self-actuate the writeback transactions needed to remedy the storage of corrupted data in memory as they are encountered.

SUMMARY OF THE INVENTION

It is an object of the present invention to provide a system and method for memory control that actuates writeback of corrupted data stored in memory upon detection.

It is another object of the present invention to provide a system and method for memory control that self-actuates writeback of corrupted data stored in memory without intervention of a master operation served thereby.

It is yet another object of the present invention to provide a system and method for memory control executing an adaptive scrubbing of corresponding memory locations as correctable error is detected in data read from memory.

It is still another object of the present invention to provide a system and method for memory control generating suitable read-modify-write commands for memory locations of read data having correctable error.

These and other objects are attained in a system for controlling access to a memory device to support processing of a master control operation. The system comprises a data control portion configured to carry out a plurality of data access operations on the memory device, which data access operations include read, write, and read-modify-write operations for selectively addressed storage locations defined in the memory device. An error control portion coupled to the data control portion executes on a processor to detect error in a data segment as stored in the memory device. The error control portion is configured to correct a data segment read from the memory device for at least one type of detected error. A command control portion coupled to the data control and error control portions generates commands for actuating the data access operations of the data control portion. The command control portion includes a corrective writeback unit executable responsive to detection of a correctable error in a data segment to actuate a read-modify-write operation of the data control portion to the storage locations corresponding to the data segment. The corresponding storage locations of the memory device are thereby adaptively scrubbed.

In accordance with certain embodiments, a memory controller system is provided for controlling access to a memory device during processing of a master control operation. The memory controller system includes a data control portion configured to carry out a plurality of data access operations on the memory device, the data access operations including read, write, and read-modify-write operations for selectively addressed storage locations defined in the memory device. An error control portion coupled to the data control portion executes on a processor to detect error in a data segment read by the data control portion from the memory device. The error control portion is configured for an Error Correcting Code (ECC) error detection and correction technique of predetermined format, such error control portion being configured to correct a data segment read from the memory device for at least one type of detected error. A command control portion is coupled to the data control and error control portions, which command control portion generates commands for actuating the data access operations of the data control portion. The command control portion includes a corrective writeback unit executable responsive to detection of a correctable error in a data segment to actuate adaptive scrubbing of the storage locations corresponding to the data segment. The adaptive scrubbing includes generation of a writeback transaction command for actuating a read-modify-write operation of the data control portion to the storage locations corresponding to the data segment. The command control portion further includes a command queue unit and a command multiplexing unit. The command queue unit stores a plurality of predetermined commands for timely execution by at least one of the data control and error control portions, the predetermined commands including the writeback transaction command. The command multiplexing unit is coupled to the corrective writeback and command queue units, and executes to selectively pass a plurality of predetermined commands to the command queue unit according to a preselected order of priority assigned thereto.

In accordance with certain other embodiments of the present invention a method is provided for controlling access to a memory device to support processing of a master control operation. The method comprises establishing a data control portion executable to carry out a plurality of data access operations on the memory device, which data access operations include read, write, and read-modify-write operations for selectively addressed storage locations defined in the memory device. An error control portion coupled to the data control portion is executed on a processor to detect error in a data segment as stored in the memory device. The method includes defining for the error control portion at least one type of correctable error in data segments read from the memory device, and establishing a command control portion coupled to the data control and error control portions for generating commands to actuate the data access operations of the data control portion. A corrective writeback is executed by the command control portion responsive to detection of a correctable error in a data segment, the corrective writeback actuating an adaptive scrubbing of the storage locations corresponding to the data segment. The adaptive scrubbing includes generation of writeback transaction command for triggering a read-modify-write operation of the data control portion to the storage locations corresponding to the data segment.

DETAILED DESCRIPTION OF THE PREFERRED EMBODIMENTS

Figure 1:
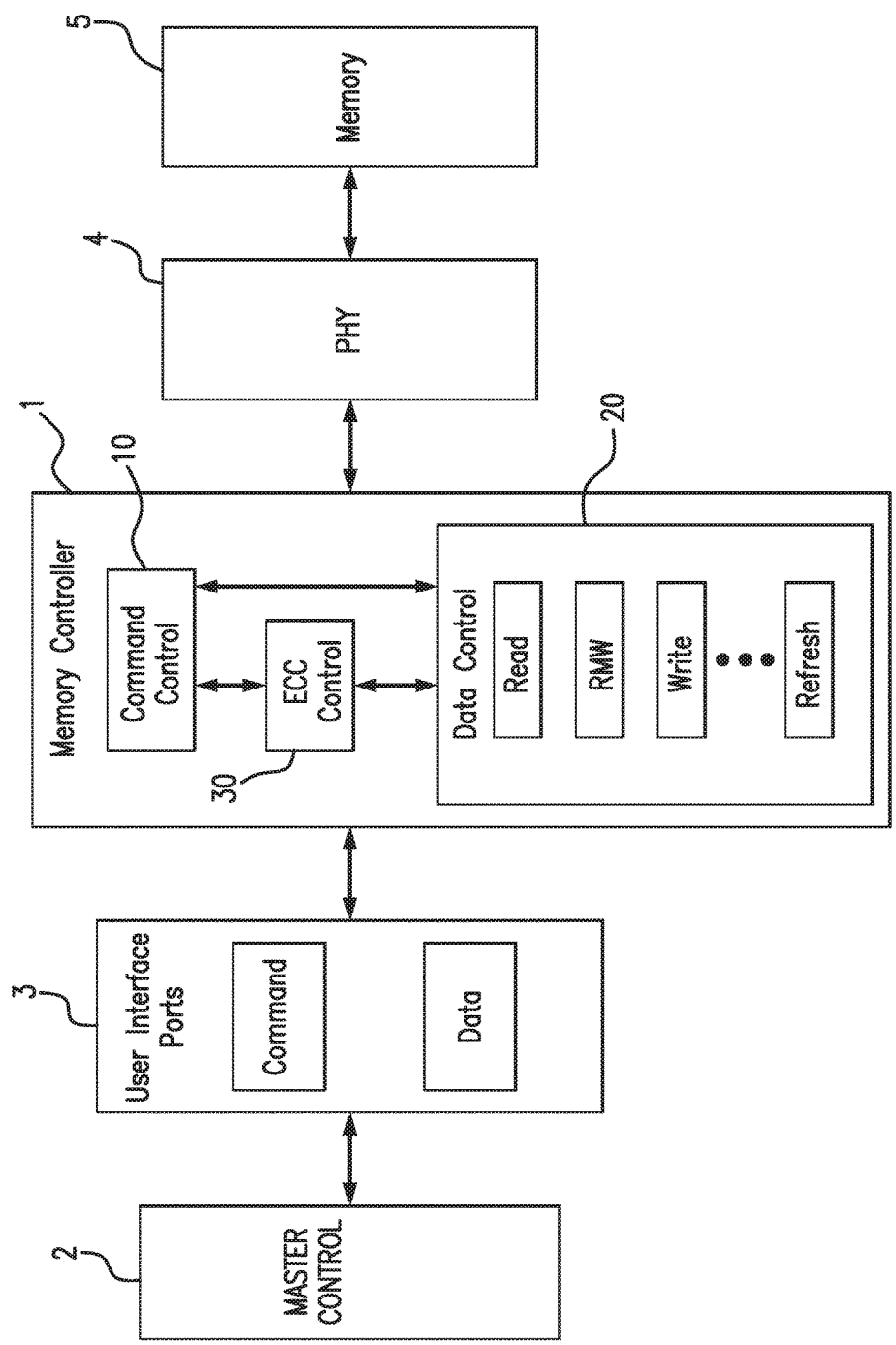
FIG. 1 is a schematic diagram illustrating a system formed in accordance with one exemplary embodiment of the present invention, operably intercoupled to provide control of memory to support processing of a master control operation, in one illustrative application.

Reference is now be made in illustrative level of detail to exemplary embodiments, which are illustrated in the accompanying drawings, wherein like reference numerals refer to the like elements throughout. The embodiments are described below in order to illustrate and explain the disclosed system and method with reference to the drawing figures.

Briefly, the subject system and method provide for a memory controller that is executable to self-actuate a writeback transaction upon detection of correctable error in data stored in the given memory device(s). The memory controller is of a type suitably configured for Error Correcting Code (ECC) or any other such error detection and correction technique known in the art. In the case of ECC, data is stored with additional ECC bits set according to a predetermined ECC format (such as the so-called SECDED, or Single-Error Correction and Double-Error Detection, format commonly used in the art).

During operation, the memory controller supports one or more control or user application operations executed on a central processing unit or other main controller (collectively referred to herein as 'master' operations or 'master' control operations), providing the memory storage and access needs of such master control operations. When data is written to memory for storage and later read out as prompted by a master control operation, ECC enables the memory controller to detect the occurrence of 'soft' errors in the data as stored—namely, those errors which cause a 'flip' of a bit value as the result of interference, radiation, or other such source of random error.

Depending on the nature and extent of the particular ECC format employed, some such detected errors are correctable and some are not. In the case of SECDED, for example, error occurring in a single bit within a predetermined segment (a word or other unit of consecutive bits by which data is transferred and stored in a given application) is both detectable and correctable, while error occurring in more than one bit within a segment of stored data may be detectable but not correctable (due to the limits of unambiguity inherent to the particular ECC format). The criteria for what does or does not constitute correctable error is therefore determined largely by the particular ECC format employed.

Those detected errors deemed to be correctable are in fact corrected by the memory controller for read out purposes, so as to avoid their corruptive effects when further processed by the master control operation. But in known memory controllers, the incorrectly written data segments themselves are typically left as they were when stored, in corrupted (albeit correctable) form. Conventionally, it is not until a scheduled scrubbing operation is carried out by the memory controller—when the memory controller would otherwise be idle—that the corrupted data segments are actually either re-written or repaired in storage. In accordance with certain aspects of the present invention, the subject memory controller is preferably configured to not only execute such conventional memory scrubbing (of any suitable type known in the art) as a general scrubbing operation, but also to selectively execute, in effect, a detection-responsive adaptive scrubbing operation that does not require the master's intervention.

Standard scrubbing operations generally include reading systematically from each memory location in question, correcting any correctable bit errors based on the ECC format employed, and writing the corrected data back to that same memory location. With an ECC format like SECDED, information is stored redundantly enough to correct single bit error per memory word, but only detect (not correct) a double bit error. The memory controller scans the given memory locations to detect any bit errors, suitably employing properties of the ECC employed (such as checksum), and reports the resulting information to the master control operation for appropriate instruction from the master to write corrected bits back to the memory locations.

This general memory scrubbing is preferably conducted frequently enough to minimize the likelihood of multiple bit errors occurring in the stored data. It is normally carried out during otherwise idle periods of processing, and typically in non-continuous manner to minimize power consumption. Applicable industry or design standards may require the guaranteed collective scrubbing of the given memory in its entirety within a specified time period.

As noted, writeback transactions carried out during general scrubbing typically involve the master control operation's cooperative intervention. Upon detection of correctable error, the memory controller reports the ECC corrected data segment information to the master, whereupon the master operation at some time thereafter executes to generate appropriate read-modify-write commands to effect the required writeback transaction, and transmits the same to the memory controller through one or more designated communication ports. Such read-modify-write commands are typically provided by the master on a data segment-by-segment basis. The memory controller receives the read-modify-write command(s), and upon confirmation as a valid command, passes the command(s) on to its command queue for timely execution.

In accordance with certain aspects of the present invention, the subject memory controller is additionally equipped with suitable measures to self-initiate the required writeback transaction to carry out an adaptive scrubbing operation. Correctable errors detected during data readout may then be correctly restored in memory (by writing back to the affected locations) on an as-needed (or as desired) basis—without having to wait for the next scheduled general scrubbing operation to occur, and without having to burden the master to generate the necessary writeback transaction. The prompt correction and restoration of corrupted data segments when correctable reduces the risk of sustaining uncorrectable error with subsequent operation (from correctable error growing into uncorrectable error).

Referring now to FIG. 1, there is shown a general schematic diagram illustrating a memory controller system 1 formed in accordance with one exemplary embodiment of the present invention operably intercoupled with other subsystems in an illustrative application. As generally shown, the memory controller system 1 serves to provide control of a memory 5 (formed by one or more memory devices of any suitable type and configuration known in the art) to support processing of a master control operation by a master controller 2. The memory controller system 1 communicates with the master controller 2 through one or more user interface ports 3, and with the memory device(s) 5 through a physical interface (PHY) 4 configured with a suitable interface standard known in the art for the memory 5.

The overall system schematically illustrated in FIG. 1 may be implemented in any known form, depending on the particular requirements of the intended application. For example, the overall system may be realized by discretely interconnected subsystems, or in sufficiently integrated in the form of a system-on-chip (SOC) or the like, depending again on the particular requirements of the intended application. As the master controller, user interface port, PHY, and memory subsystems 2, 3, 4, and 5 may be of any suitable type and configuration known in the art, subject to the particular requirements of a given application, no further description thereof is needed for description of features relating to the memory controller system 1. Those skilled in the art will recognize that the overall system shown will typically include numerous other subsystems, logic components, driver circuit portions, and the like other than those generally illustrated in FIG. 1 to carry out its particularly intended functions. In the interests of brevity and clarity, those particular functions outside the system and method disclosed herein are not shown, but will be apparent to those skilled in the art in the context of the particular application intended.

Memory controller system 1 generally includes a command control portion 10 coupled to a data control portion 20 and an error control portion 30. In the embodiment shown, the data control portion 20 preferably includes one or more digital circuits which implement the functional logic to carry out a plurality of data access operations on memory 5. These data access operations include read, write, and read-modify-write operations conducted on selectively addressed storage locations defined in the memory 5. The data access operations preferably include control of such additional functions as periodic data refresh (as required by the particular type of memory device(s) 5 employed) and/or others known in the art.

The error control portion 30 is operably coupled to the data control portion 20, and preferably includes one or more digital circuits which implement the functional logic for detecting and correcting error in data segments as stored in memory 5. The error control portion 30 preferably includes execution of ECC processing of predetermined code format, such as SECDED, to detect error in a corrupted data segment read from the memory 5. The error control portion 30 is configured to correct the data segment read from the memory having error that is correctable with the given ECC, and report (for the master control operation) those data segment errors which are detected but are not correctable with the given ECC.

The command control portion 10 is operably coupled to both the data control and error control portions 20, 30. The command control portion 10 is preferably formed by one or more digital circuits which implement the functional logic for generating commands to actuate various data access operations of the data control portion 20. The command control portion 10 includes a corrective writeback unit which executes responsive to detection of a correctable error in a data segment to actuate a read-modify-write operation by the data control portion 20 on the storage locations corresponding to the corrupt data segment. The corresponding storage locations of the memory 5 are adaptively scrubbed as a result.

Figure 2:
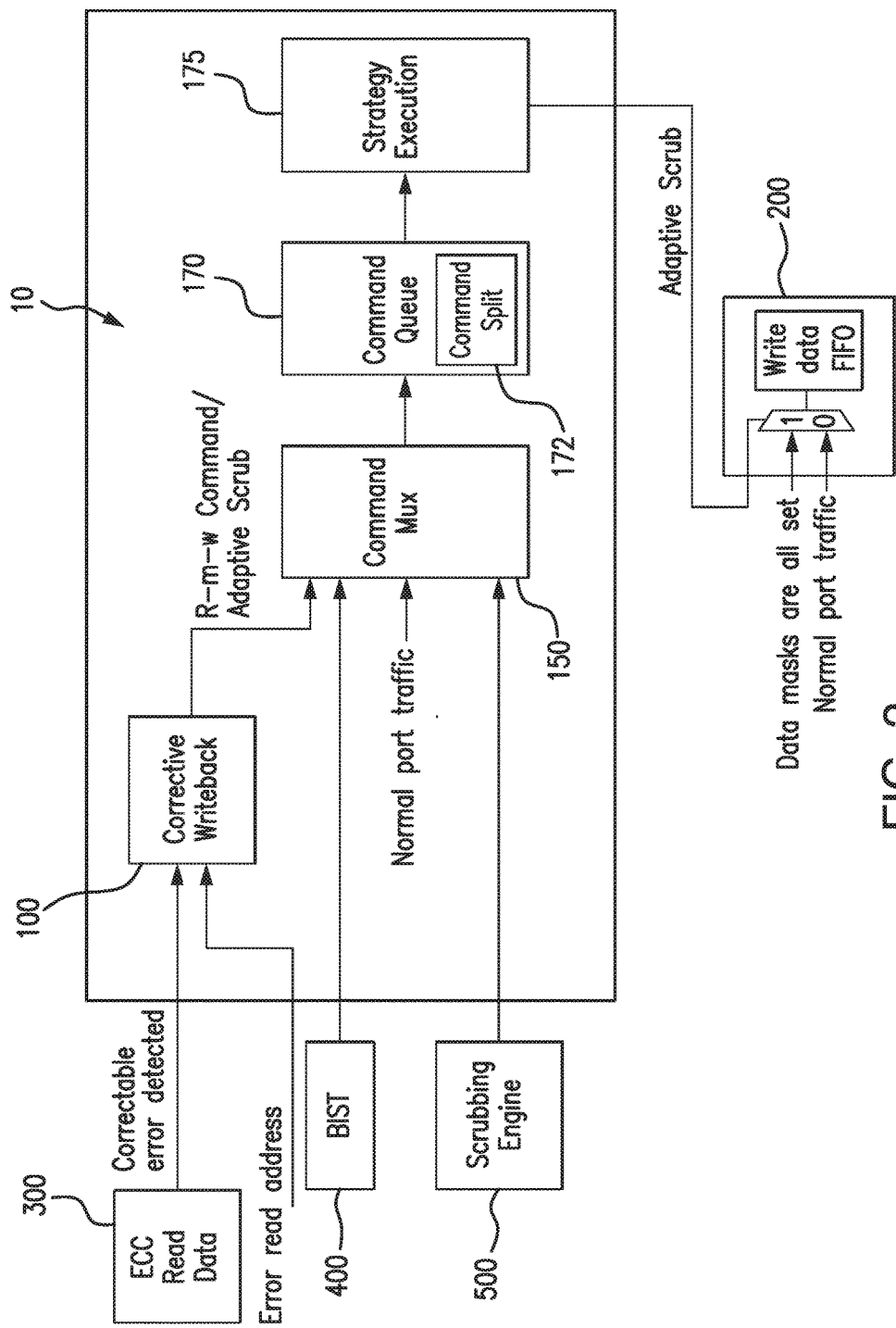
FIG. 2 is a schematic diagram showing one exemplary embodiment of a command control portion of the system embodiment shown in FIG. 1, illustrating certain operable coupling thereof with other portions of the system in a sample application.

Referring to FIG. 2, there is shown a schematic diagram illustrating the intercoupling of certain functional units of the command control portion 10 of the memory controller system 1, as formed in accordance with one exemplary embodiment of the present invention. In the interests of brevity and clarity, only certain parts (units/modules/sections) of the overall command control portion 10 pertaining to its corrective data writeback function are illustrated. Those other parts of the command control portion 10, as well as the other portions 20, 30 of the memory controller system 1, which are not shown or specifically described may be of any suitable type known in the art configured to suit the particularly intended application. The particular details of such other parts and portions will be apparent to those skilled in the art.

In accordance with certain aspects of the present invention, command control portion 10 of the memory controller system 1 incorporates a self-actuated writeback capability that is integrated to the extent practicable to make use of the memory controller system's other conventional capabilities. This includes known memory controller systems' use of read-write-modify commands to carry out periodic scrubbing of the given memory. In the illustrated embodiment, this writeback is actuated by a corrective writeback unit 100 coupled to a command multiplexing unit 150, which is coupled in turn to a command queue unit 170.

The corrective writeback unit 100 is coupled to receive correctable error information relating to a data segment read operation from an error correcting unit 300. The error correcting unit 300 implements a suitable error detection and correction technique known in the art, preferably implementing in the example shown an ECC of predetermined format. The corrective writeback unit 100 receives ECC signals indicating, for instance, the particular correctable error detected. Unit 100 also receives the read address associated with the data segment having the detected correctable error. The read address is preferably received from a read unit (not shown) conventionally employed in the data control portion 20 of the memory controller system 1. The corrective writeback unit 100 then generates a corresponding read-modify-write command for entry into the command queue unit 170 and subsequent execution.

The command queue unit 170 receives and registers commands from not only the master control operation (through user interface ports 3), but also from other functional units. Depending on the particular application, these include for example a built-in-self-test (BIST) unit 400 and a general scrubbing engine 500, and the like. Certain parts of these functional units may be disposed as part of the command control portion 10, depending on the particular requirements of the intended application. In accordance with certain aspects of the present invention, the command queue 200 also receives and queues up the ECC-responsive writeback commands generated by the corrective writeback unit 100 for prompting and guiding adaptive scrubbing of the memory locations found to contain corrupted yet correctable data. The command multiplexing unit 150 is preferably interposed to efficiently manage and reconcile the variously-derived commands competing to be pushed into the command queue unit 170.

Communications traffic in the illustrated embodiment includes commands and data which are preferably transmitted in burst mode, for heightened data throughput. Accordingly, the command control portion 10 preferably also includes in the command queue unit 170 a command split section 172 which executes to enforce a predefined burst limit (set to a burst limit of one in the illustrated embodiment) for each command entered in said command queue unit. The command split section 172 also executes to confirm acceptance of each command entry which satisfies the burst limit condition, and accordingly generates a command acceptance signal in that regard. As described in following paragraphs, this command acceptance signal is preferably fed back to the corrective writeback unit 100 to regulate the orderly, burst-appropriate issuance of successive writeback commands.

The command control portion 10 preferably includes as well an execution strategy unit 175 coupled to the command queue unit 170. The execution strategy unit 175 executes to selectively direct accepted command entries of the command queue unit 170 to corresponding parts of the error control and data control portions 20, 30 for timely execution thereby. The execution strategy unit 175 serves in the meantime to hold the command under execution, preferably issuing accepted commands burst by burst.

In the exemplary embodiment shown, the command control portion 10 is illustratively configured for implementation in a memory controller for controlling a DDR (double data rate) synchronous dynamic random-access memory (DDR SDRAM) that utilizes ECC of SECDED format. As noted, SECDED ECC detects both single and double bit errors, but only corrects for single bit errors in the data. Much as in conventional DDR memory controllers employing such ECC, system 10 is suitably equipped with base measures for detecting a single bit error on the read data and correcting that data for use. Also as in conventional DDR memory controllers, if the read is part of a read-modify-write operation originated by the master as part of a general memory scrubbing operation, the corrected read data is also written back to memory (or overwritten with new write data). Otherwise, if the read data is intended for return to the master, the corrected data is accordingly returned, along with an interrupt to indicate the data was corrected.

In accordance with certain aspects of the present invention, the memory controller system 1 not only returns the corrected data in that case, it also self-initiates a writeback of that corrected data to memory. The command control portion 10 of the system queues up a fully masked write command, for recognition downstream much as if it were a normal read-modify-write instruction to write back the corrected data, thereby carrying out an adaptive scrubbing of the data's location in memory.

As noted, this adaptive scrubbing—whereby ECC writeback is self-actuated by the memory controller system 10 upon detection of correctable error preferably makes use of standard memory controller capabilities built therein, such as the capability to write back data during a standard scrubbing operation. During adaptive scrubbing, a corresponding burst of data is written back to memory as directed by the command generated by the corrective writeback unit 100, when a correctable error is detected during any read operation. For simplicity, system 10 preferably carries out the adaptive scrubbing writeback in this regard as if it were a dummy read command That is, the writeback command is processed much like a normal read command, except that the data is discarded when it enters a read data FIFO in a read out unit of suitable type known in the art (not shown).

Memory controller system 1 in the illustrated embodiment employs a masked writing approach, where the data provided from the user interface ports 3 are logically combined with a mask at a write unit 200 of the data control portion 20. Where write data is fully masked, the resulting write operation constitutes a read-modify-write operation. The corrective writeback unit 100 takes advantage of this functionality in the illustrated embodiment by queuing up a fully masked write command when a corrected read is detected. As illustrated, during a corrective writeback read-modify-write operation, a signal is passed to the write unit 200 that the given write is being actuated by the adaptive scrub operation (and therefore not responsive to a general scrubbing command received from the master through the user interface ports 3). The write unit 200 then receives a write command with all mask bits asserted (or, conversely, all strobe bits de-asserted). The mask elements are suitably set in value, such that all of the data that has been read is written back into the corresponding memory locations.

Figure 3:
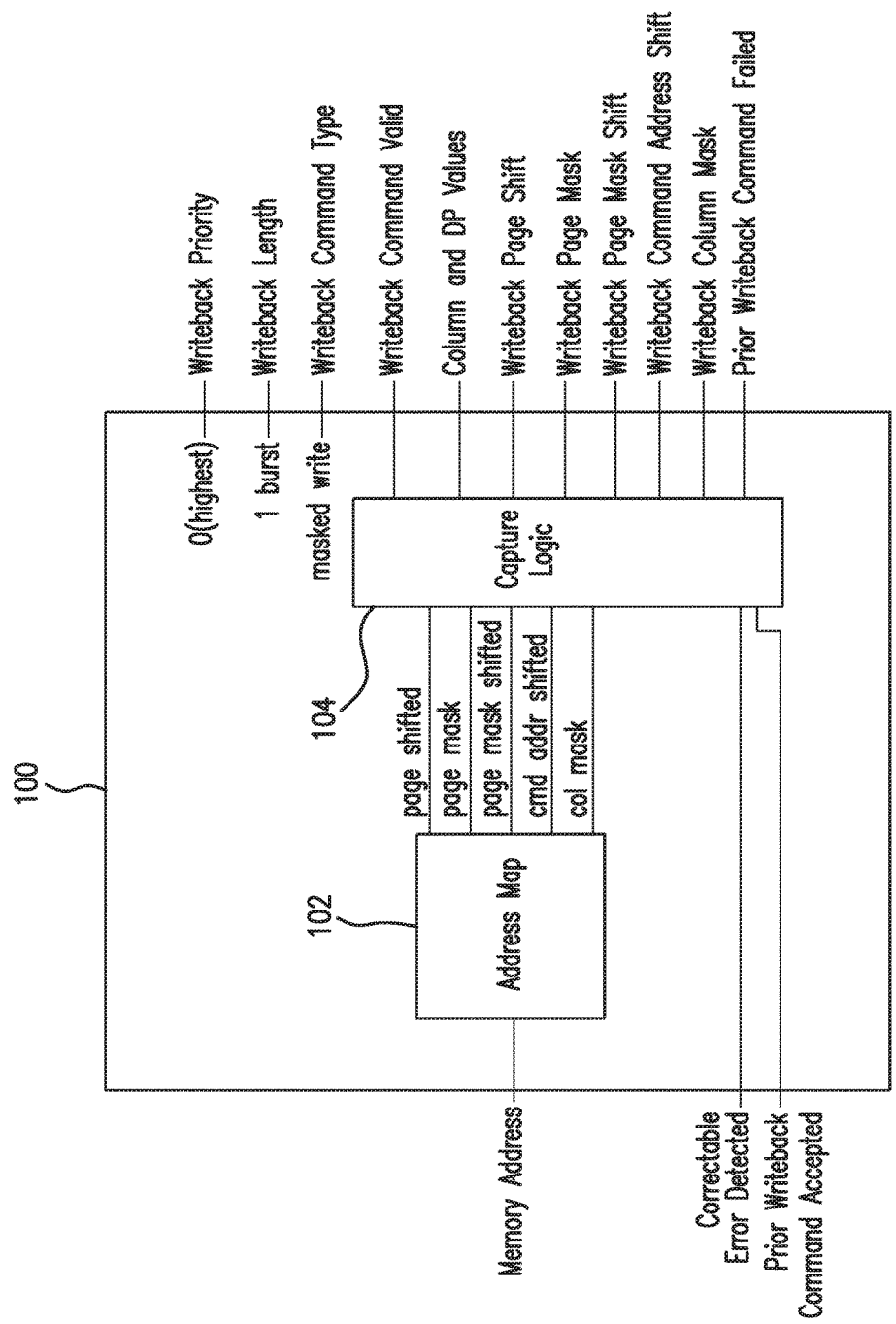
FIG. 3 is a schematic diagram showing one exemplary embodiment of a corrective writeback unit the command control portion embodiment shown in FIG. 2, illustrating examples of component signals generated for a writeback transaction command in a sample application.

Turning to FIG. 3, there is shown a schematic diagram illustrating in more detail one exemplary embodiment of the corrective writeback unit 100 provided in the command control portion 10. Unit 100 includes a memory address mapping section 102 and a capture logic section 104 coupled thereto. The memory address mapping section 102 implements the functional logic for translating the error read address associated with the ECC corrected data into the given memory's device-specific addressing format. The read address is typically maintained in the user's (master's) addressing format for reporting to the master as needed.

Preferably, when the error read address is received by the corrective writeback unit 100, it is preferably first burst aligned (not shown) and thereafter registered for translation by the memory address mapping section 102. The memory address mapping section 102 serves to translate the error read address as necessary—from the user's addressing format to an addressing format compatible with the given memory device 5. The error read address is thereby translated to an address defined in terms of device-specific address parameters of the given memory device (to reflect the row, column, page, or other such storage cell arrangement/organization thereof), for incorporation into a suitable read-write-modify command.

The capture logic section 104 implements the functional logic for collecting and construct the corrective writeback read-write-modify command in a manner sufficient to actuate the required writeback transaction. The capture logic section 104 executes to incorporate in the command the error read address as translated by the memory address mapping section 102. The section 104 includes suitable measures for latching the translated error read address from the memory address mapping section 102, along with a plurality of parametric signal components to populate the required read-modify-write command. The section 104 ensures that this writeback transaction command is consistent in format with a read-modify-write command of the form otherwise generated by the master control operation, for instance, during a general scrubbing of the memory device 5.

Figure 4:
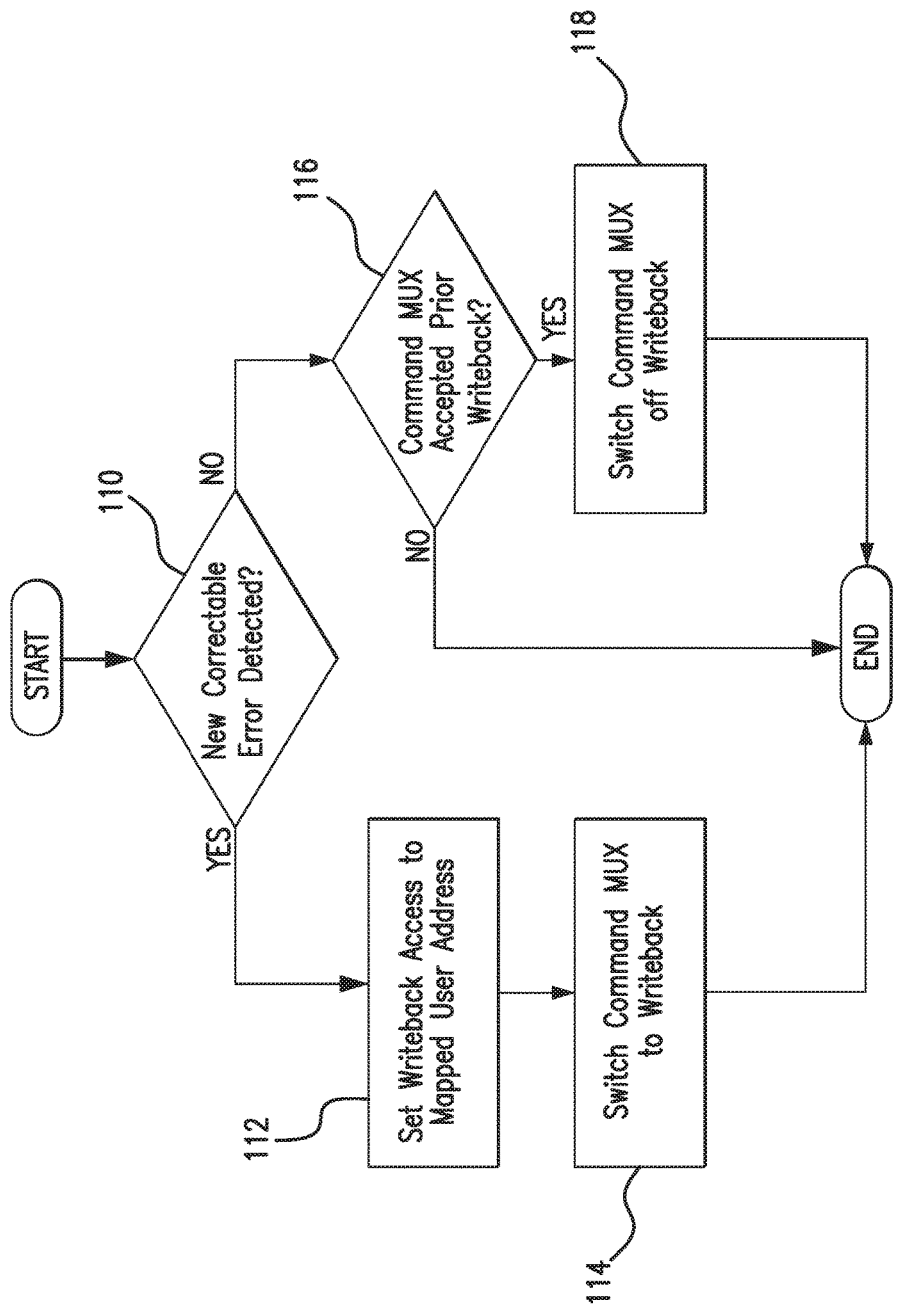
FIG. 4 is a flow diagram illustrating the flow of command capture logic carried out by the corrective writeback unit embodiment of FIG. 3, in a sample application; and, FIG. 5 is a schematic diagram one exemplary embodiment of a command multiplexing unit within the command control portion embodiment shown in FIG. 2, illustrating examples of signals associated therewith in a sample application.

Referring to FIG. 4, a flow of processes in a portion of the logic executed by the capture logic section 104 in the illustrated embodiment is shown. At block 110, the section 104 determines based on its signal inputs whether a new correctable error has been detected in a data segment that has been read out of memory 5. If so, the flow proceeds to block 112, where the error read address for the data segment having the detected error is accessed in user addressing format. The command multiplexing unit 150 is responsively switched at block 114 to enable passage of a corrective writeback command into the command queue unit 170 therethrough.

If at block 110, the section 104 finds from its input signals no indication of a new correctable error detection, the flow proceeds alternatively to block 116, where the command multiplexing unit 150 is checked for indication a prior writeback command having been accepted. If so, the flow proceeds to block 118, where the command multiplexing unit 150 is switched to disable passage of a corrective writeback command into the command queue unit 170 therethrough.

Turning back to FIG. 3, the corrective writeback unit 100 constructs the corrective writeback transaction command preferably in the form of a read-modify-write command. This command is passed for acceptance to the command queue unit's command split section 172, formatted in the illustrated embodiment as a burst write command with mask pins correspondingly set. The appropriate location bits for this read-modify-write command are preferably set much as if the command had been sent from a user interface port 3 (from the master). An additional bit is preferably employed to accompany the command and indicate that it has not originated from such user interface port 3. This avoids any unwanted interaction with responses or data from any of the ports 3.

The corrective writeback unit 100 receives and operates based on various parametric input signals. Examples of such input signals in the exemplary embodiment and application shown include:

Correctable Error Detected: A correctable error on a data read was detected when the corrective writeback unit 100 was enabled, so a corrective read-modify-write command is to be issued to the same address of that data to correct it automatically.

Memory Address: This is the unshifted address (i.e. user addressable format) that the read address for a detected error is maintained in, in case the error address needs to be reported to the user.

Prior Writeback Command Accepted—Indication from the split section of the command queue unit 170 that the immediately preceding corrective writeback command has been accepted, and the corrective writeback data is being queued up in the command queue for execution in turn, subject to applicable priorities.

The corrective writeback unit 100 constructs the corrective writeback read-modify-write command by providing certain parametric signal constituents as its outputs. Examples of such parametric signal constituents as descriptively indicated in FIG. 3 for the illustrated application. The actual parametric signal constituents required for a given application will depend on the particular requirements of that application. By way of illustrative example, the parametric signal constituents of the read-modify-write command in the exemplary embodiment and application shown include the following signals output by unit 100:

Writeback Priority: Sets the priority level for execution of the given command (relative to the other command entries of the command queue unit 170). The parameter is tied to zero in the example shown, giving it the highest priority.

Writeback Length: Preferably calculated, for instance, in TCL and hard-corded to the length of one burst in the example shown.

Writeback Command Type: Reflects the type of data write to be executed. The parameter is set to zero in the example shown, except to indicate a masked write bit, in which case it is set to one.

Writeback Command Valid: Indicates that a corrective writeback command constituents for a valid read-modify-write command are ready for passage to the command queue unit 170. The command split section 172 uses this parametric signal to determine the acceptability of the command to be queued up.

Column and DP Values: Indicates column and DP bits of error read address in user addressable format. The address is provided for example in the form ['START_COL:0].

Writeback Page Shift; Writeback Page Mask; Writeback Mask Shift; Writeback Command Address; Writeback Command Address Shift; Writeback Column Mask Shift: These signals relate to the translated addressing information provided by the address mapping section 102.

Prior Writeback Command Failed: Indicates that the prior corrective writeback command failed. Depending on the embodiment and application, this may indicate a burst limit violation for a command, for example, and indicate that the current/new corrective writeback command is being held accordingly from issuance.

Preferably, the priority of the corrective writeback read-modify-write command is set to be high, as shown, so that its adaptive scrubbing operation may occur as early as possible. The command split section 172 will recognize this as a burst read-modify-write and queue up the read and write into the command queue. By doing a read-modify-write, even if a subsequent write has occurred to this location after the corrected read, the memory will not be corrupted—it will simply write back whatever data is in that location with the correct ECC.

The detection of the need to issue a corrective writeback command for such adaptive scrubbing is preferably generated during a data segment read operation. When the read data segment is returned with a correctable error that is not already part of a general read-modify-write operation, and if the corrective writeback unit 100 is active (preferably employing a suitable corrective writeback enable parameter whose assertion alternatively activates or deactivates the feature), an issue/queue writeback signal is preferably generated and sent to the corrective writeback unit 100 to convert the error read address into user format. From there, the converted information is multiplexed into the command queue. The issue/queue writeback signal is preferably used both to steer the command path mux to this operation and to assert the command valid that the split section 172 needs for the command. The actual command is preferably a single burst write (this can essentially be 'hard-coded') with a burst address that is derived from the error read address of a corrected ECC read command.

The strategy execution unit 175 is configured to recognize this alternative command source and pull the write data for the command from a different source. The alternative source may be hard-coded data and mask pins. The write data itself during this alternative write operation is irrelevant, as only the read data will be used and the mask pins will all be asserted. Therefore, the data status for the write will preferably indicate "available" as soon as the read data is available.

Given the burst mode transmission used in the illustrated embodiment, the command queue unit 170 preferably includes as noted a split section 172 suitably configured to split any command entry that spans multiple bursts, so that each command entry is contained within a single burst for execution by a strategy enforcement unit. In addition, the corrective writeback unit 100 preferably implements suitable measures to ensure that a corrective writeback read-modify-write command is fully contained in one transmission burst. Toward that end, the unit 100 aligns a given error read address accordingly, such that the resulting read-modify-write command remains one burst wide and with the address substantially at a burst boundary. The read-modify-write command is constructed in this manner from information typically available during conventional ECC memory controller operation. The command is so formatted that conventional capabilities already in place for further downstream processing of standard read-modify-write commands (such as issued as part of a scheduled general scrubbing operation, for example) may recognize, and in response automatically read the error, correct it, then write into the corresponding memory location.

The corrective writeback unit 100 preferably also implements suitable measures to ensure that only one burst writeback command is issued at a time. That is, a newly-generated corrective writeback read-modify-write command is held from passage to the command queue unit 170 if another prior corrective writeback command is undergoing execution. Toward that end, the capture logic section 104 receives a feedback signal (preferably from command multiplexing unit 150) that the prior writeback command was in fact accepted. The section 104 sets the writeback command valid signal to hold issuance of the current corrective read-modify-write command (even if fully constructed and ready for passage to the command queue) until indication that the prior writeback command was accepted, and that another corrective writeback command is free to issue.

In this regard, if the command queue unit 170 for instance should take excessive time to accept the non-port derived corrective writeback command, and multiple reads were to come back with correctable error in close time proximity, it is possible that an issue/queue writeback command will assert while the corrective writeback unit 100 is still awaiting assertion from the split section 172 that the prior corrective writeback command was accepted. Consequently, the current (new) corrective writeback command could be dropped in the interim. Suitable measures may be incorporated into or in connection with the corrective writeback unit 100 to accommodate such situations. This may include for example, providing supplemental storage in the form of a FIFO device or the like to provide temporary storage of overlapping or substantially concurrent corrective writebacks for such corner cases of operational scenarios.

Otherwise, an interrupt may be flagged in such situations to at least indicate, for instance, corrective writeback overflow conditions. This may be sufficient in many embodiments, as correctable read errors tend to be rare enough events in most cases that the likelihood of corrective writeback overflow conditions like tend to be are quite low (since multiple reads with correctable errors in close time proximity would typically be even more rare).

Figure 5:
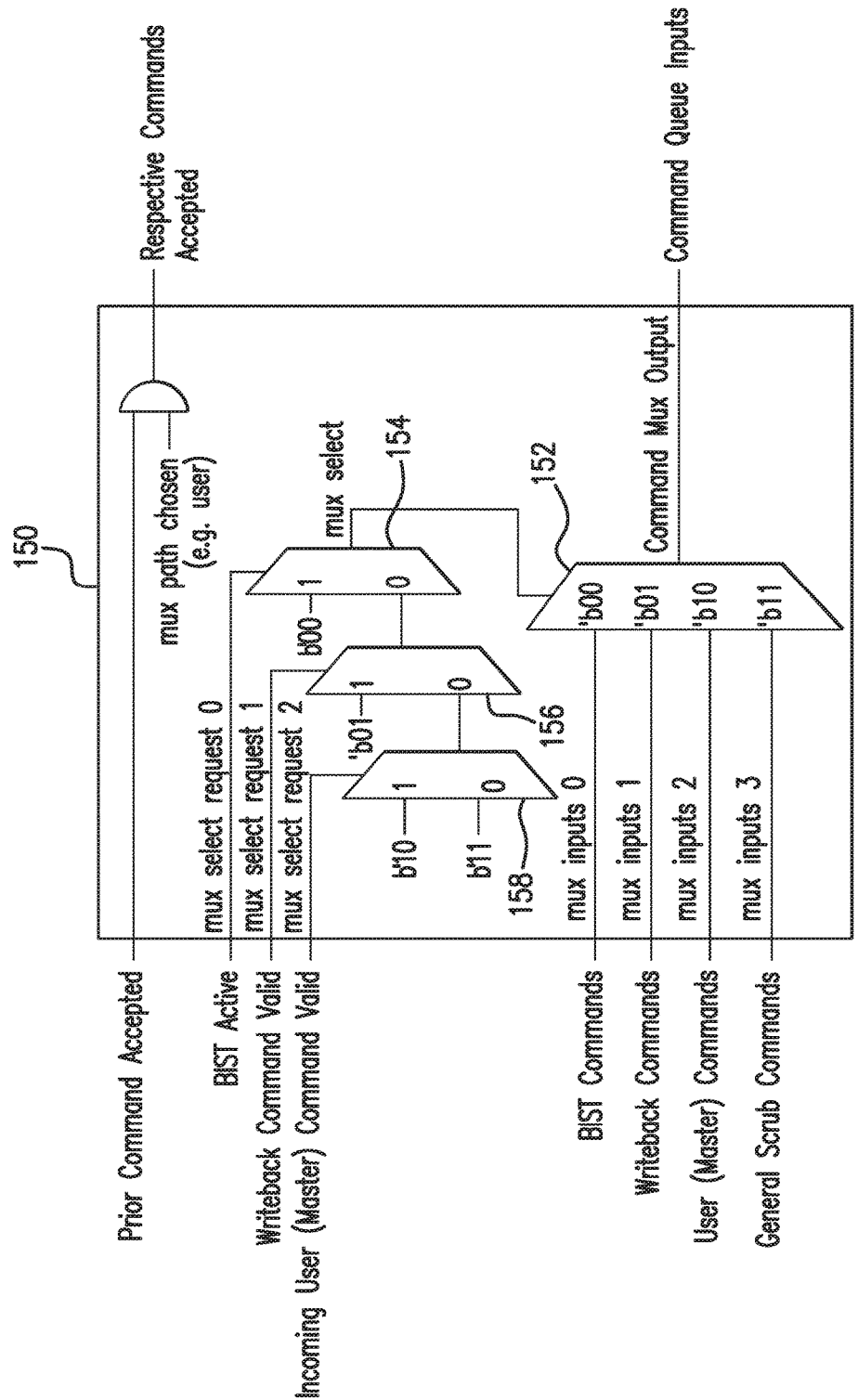

Turning now to FIG. 5, there is shown a schematic diagram illustrating in more detail one exemplary embodiment of the command multiplexing unit 150 provided in the command control portion 10. Unit 150 implements the functional logic for multiplexing commands from various sources for passage to the command queue unit 170 for possible entry in the commands entered and queued for execution. Unit 150 preferably includes an input multiplexing section 152 and a plurality of select multiplexing sections 154, 156, 158. The input multiplexing section 152 receives the corrective writeback command issued by the corrective writeback unit 100, as well as other input commands directed to the command queue for entry. In the example shown, these other input commands include, for instance, BIST commands, general scrubbing commands from the scrubbing engine 500, and general user commands received from the master control operation through the user interface ports 3. Selective passage of these input commands to the section 150 is switched according to a select signal determined cooperatively by the select multiplexing sections 154, 156, 158 based on respective state indications (active or valid) corresponding to the input commands, as schematically shown.

Preferably, the command multiplexing unit 150 implements selection logic encoded to establish a priority-based passage scheme. In the example shown, for instance, the select multiplexing sections 154, 156, 158 are suitably intercoupled such that the BIST active indication controls the functionally most proximate select multiplexing section 154 (as to the input multiplexing section 152), and the corrective writeback command valid and user command valid successively control the next select multiplexing sections 156, 158. A BIST active indication thus activates the 'b00 BIST command selection of the input multiplexing section 152 to the exclusion of others, thereby overriding the competing valid indications of those other commands for passage into the command queue unit 170. Next, a writeback command valid indication, in the absence of a BIST active indication, activates the 'b01 writeback command selection of the input multiplexing section 152, thereby override the user command valid indication for passage into the command queue unit 170. The User command valid indication is subordinate to both the BIST active and writeback command valid indications, and in the absence of those higher priority indications, activates the 'b10 user command selection of the input multiplexing section 152 for passage into the command queue unit 170. The lowest level of priority is reserved in this example to the general scrub command, whose 'b11 selection in the input multiplexing section 152 only activates if none of the other commands' active and valid indications is asserted.

The command multiplexing unit 150 preferably receives a different instance of a command accepted signal from the split section 172 of the command queue for each input command path that returns an indication to a current command's requestor that the current command has in fact been passed into the command queue. This return indication for each command path (for the BIST, corrective writeback, user, and general scrub commands in the example shown) is dependent the current path selected for passage through the input multiplexing section 152 and an indication asserted by the split section 172 as to acceptance of the prior command for the given command path. This is schematically represented by the logical AND combination of the current and prior command indications as shown.

One or more portions of the system embodiments disclosed herein may include a computer processor based implementation, the system embodiments may include a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for controlling access to a memory device to support processing of a master control operation, comprising:

a data control portion configured to carry out a plurality of data access operations on the memory device, the data access operations including read, write, and read-modify-write operations for selectively addressed storage locations defined in the memory device;

an error control portion coupled to said data control portion, said error control portion executing on a processor to detect error in a data segment as stored in the memory device, said error control portion being configured to correct a data segment read from the memory device for at least one type of detected error; and, a command control portion coupled to said data control and error control portions, said command control portion generating commands for actuating the data access operations of said data control portion, said command control portion including a corrective writeback unit executable responsive to detection of a correctable error in a data segment to actuate a read-modify-write operation of said data control portion to the storage locations corresponding to the data segment, wherein said corrective writeback unit generates a writeback transaction command responsive to the detection of a correctable error in a data segment and said writeback transaction command triggers a corresponding read-modify-write operation by said data control portion, the corresponding storage locations of the memory device being thereby adaptively scrubbed;

said command control portion including a built-in-self-test (BIST) unit and a general scrubbing engine and said command control portion selectively passing one of a plurality of predetermined commands according to a preselected order of priority assigned thereto, wherein said predetermined commands include said writeback transaction command generated by said corrective writeback unit, a BIST transaction command generated by said BIST unit, a scrubbing transaction command generated by said general scrubbing engine, and a user transaction command generated by the master control operation; and, said writeback transaction command being assigned a lesser priority than said BIST transaction command and a greater priority than said scrubbing transaction and user transaction commands.

2. The system as recited in claim 1, wherein said command control portion includes a command queue unit storing a plurality of commands for timely execution by at least one of said data control and error control portions.

3. The system as recited in claim 2, wherein said command control portion includes a command multiplexing unit coupled to said corrective writeback and command queue units, said command multiplexing unit selectively passing one of said plurality of predetermined commands to said command queue unit according to said preselected order of priority assigned thereto.

4. The system as recited in claim 1, wherein said error control unit is configured for an Error Correcting Code (ECC) error detection and correction technique of predetermined format.

5. The system as recited in claim 4, wherein the ECC of said error control unit is of Single-Error Correction and Double-Error Detection (SECDED) format.

6. The system as recited in claim 4, wherein said corrective writeback unit includes:

a memory address mapping section executing to translate an error read address corresponding to a data segment having correctable error between a first addressing format compatible with the master control operation and a second addressing format compatible with the memory device; and, a capture section executing to construct said writeback transaction command incorporating the error read address translated by said memory address mapping section.

7. The system as recited in claim 6, wherein:

said command control portion is configured for burst mode communication;

said corrective writeback unit is configured to execute burst alignment for aligning the error read address in the first addressing format with a burst boundary of a predefined transmission burst and pass the burst boundary aligned error read address to said memory address mapping section; and, said capture section latches the translated error read address from said memory address mapping section and a plurality of predetermined writeback parametric components to form said writeback transaction command consistent in format with a read-modify-write command generated by the master operation during general scrubbing of the memory device.

8. The system as recited in claim 7, wherein said capture section executes to limit issuance of said writeback transaction command to once per transmission burst.

9. The system as recited in claim 7, wherein:

said command control portion further includes an execution strategy unit and a command queue unit coupled thereto, said execution strategy unit selectively passing the commands stored in said command queue unit to corresponding ones of said error control and data control portions for timely execution thereby; and, said command queue unit includes a command split section executing to enforce a one burst limit for each command entered in said command queue unit.

10. A memory controller system for controlling access to a memory device during processing of a master control operation, comprising:

a data control portion configured to carry out a plurality of data access operations on the memory device, the data access operations including read, write, and read-modify-write operations for selectively addressed storage locations defined in the memory device;

an error control portion coupled to said data control portion, said error control portion executing on a processor to detect error in a data segment read by said data control portion from the memory device, said error control portion being configured for an Error Correcting Code (ECC) error detection and correction technique of predetermined format, said error control portion being configured to correct a data segment read from the memory device for at least one type of detected error; and, a command control portion coupled to said data control and error control portions, said command control portion generating commands for actuating the data access operations of said data control portion, said command control portion being configured for burst mode communication and including:

a corrective writeback unit executable responsive to detection of a correctable error in a data segment to actuate adaptive scrubbing of the storage locations corresponding to the data segment, the adaptive scrubbing including generation of a writeback transaction command for actuating a read-modify-write operation of said data control portion to the storage locations corresponding to the data segment;

a command queue unit storing a plurality of predetermined commands for timely execution by at least one of said data control and error control portions, said predetermined commands including said writeback transaction command; and, a command multiplexing unit coupled to said corrective writeback and command queue units, said command multiplexing unit selectively passing a plurality of predetermined commands to said command queue unit according to a preselected order of priority assigned thereto; and wherein said corrective writeback unit includes:

a memory address mapping section executing to translate an error read address corresponding to a data segment having correctable error between a first addressing format compatible with the master control operation and a second addressing format compatible with the memory device, wherein said corrective writeback unit is configured to execute burst alignment for aligning the error read address in the first addressing format with a burst boundary of a predefined transmission burst and pass the burst boundary aligned error read address to said memory address mapping section; and, a capture section executing to construct said writeback transaction command incorporating the error read address translated by said memory address mapping section, wherein said capture section latches the translated error read address from said memory address mapping section and a plurality of predetermined writeback parametric components to form said writeback transaction command consistent in format with a read-modify-write command generated by the master operation during general scrubbing of the memory device.

11. The system as recited in claim 10, wherein the ECC of said error control unit is of Single-Error Correction and Double-Error Detection (SECDED) format.

12. The system as recited in claim 10, wherein:

said command control portion includes a built-in-self-test (BIST) unit and a general scrubbing engine;

said predetermined commands further include a BIST transaction command generated by said BIST unit, a scrubbing transaction command generated by said general scrubbing engine, and a user transaction command generated by the master control operation; and, said writeback transaction command is assigned a lesser priority than said BIST transaction command in said command multiplexing unit for passage to said command queue unit, and a greater priority than said scrubbing transaction and user transaction commands.

13. A method for controlling access to a memory device to support processing of a master control operation, comprising:

establishing a data control portion executable to carry out a plurality of data access operations on the memory device, the data access operations including read, write, and read-modify-write operations for selectively addressed storage locations defined in the memory device;

establishing an error control portion coupled to said data control portion, said error control portion executing on a processor to detect error in a data segment as stored in the memory device;

defining for said error control portion at least one type of correctable error in data segments read from the memory device;

establishing a command control portion coupled to said data control and error control portions for generating commands to actuate the data access operations of said data control portion, wherein said command control portion is configured for burst mode communication; and, executing a corrective writeback in said command control portion responsive to detection of a correctable error in a data segment, said corrective writeback actuating an adaptive scrubbing of the storage locations corresponding to the data segment, the adaptive scrubbing including generation of a writeback transaction command for triggering a read-modify-write operation of said data control portion to the storage locations corresponding to the data segment;

wherein said corrective writeback includes:

executing a memory address mapping section to translate an error read address corresponding to a data segment having correctable error between a first addressing format compatible with the master control operation and a second addressing format compatible with the memory device, said corrective writeback being configured to execute burst alignment for aligning the error read address in the first addressing format with a burst boundary of a predefined transmission burst and pass the burst boundary aligned error read address to said memory address mapping section;

executing a capture section to construct said writeback transaction command incorporating the error read address translated by said memory address mapping section; and, latching in said capture section the translated error read address from said memory address mapping section and a plurality of predetermined writeback parametric components to form said writeback transaction command consistent in format with a read-modify-write command generated by the master operation during general scrubbing of the memory device.

14. The method as recited in claim 13, further comprising:

establishing a command queue for storing a plurality of commands for timely execution by at least one of said data control and error control portions; and, establishing a command multiplexing unit coupled to said command queue to selectively pass a plurality of predetermined commands to said command queue according to a preselected order of priority assigned thereto, said predetermined commands including said writeback transaction command.

15. The method as recited in claim 14, wherein:

said error control portion is configured for an Error Correcting Code (ECC) error detection and correction technique.

\* \* \* \* \*